(12) United States Patent
Brick

(10) Patent No.: US 8,674,391 B2
(45) Date of Patent: Mar. 18, 2014

(54) OPTOELECTRONIC SEMICONDUCTOR COMPONENT, LIGHTING DEVICE AND LENS

(75) Inventor: Peter Brick, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/574,811

(22) PCT Filed: Dec. 28, 2010

(86) PCT No.: PCT/EP2010/070820
§ 371 (c)(1),
(2), (4) Date: Aug. 16, 2012

(87) PCT Pub. No.: WO2011/098191
PCT Pub. Date: Aug. 18, 2011

(65) Prior Publication Data
US 2012/0299030 A1    Nov. 29, 2012

(30) Foreign Application Priority Data
Feb. 12, 2010 (DE) .......................... 10 2010 007 751

(51) Int. Cl.
*H01L 33/00* (2010.01)
(52) U.S. Cl.
USPC .................... 257/98; 359/642; 257/E27.12

(58) Field of Classification Search
USPC ....................... 257/88, 98; 359/642
See application file for complete search history.

(56) References Cited

U.S. PATENT DOCUMENTS

| 6,273,596 | B1 | 8/2001 | Parkyn, Jr. |
| 2004/0061120 | A1 | 4/2004 | Mizuyoshi |
| 2009/0032827 | A1 | 2/2009 | Smits |
| 2009/0284951 | A1 | 11/2009 | Muschaweck |

FOREIGN PATENT DOCUMENTS

| CN | 201330994 | 10/2009 |
| DE | 10 2006 050 880 A1 | 4/2008 |
| WO | 2009/015605 A1 | 2/2009 |

*Primary Examiner* — Julio J Maldonado
*Assistant Examiner* — Robert Bachner
(74) *Attorney, Agent, or Firm* — DLA Piper LLP (US)

(57) ABSTRACT

An optoelectronic semiconductor component for a lighting device including a carrier, at least one optoelectronic semiconductor chip mounted on the carrier and which includes a radiation passage face remote from the carrier, by which a plane is defined, and a lens comprising 1) a radiation exit face, which, relative to a height above the plane, exhibits a minimum, in particular in a central region, and at least two local maxima, and at least two local maxima, and 2) at least two connecting embankments which each extend from one of the maxima to another of the maxima, and each connecting embankment comprises a saddle point higher than the minimum and lower than the maxima adjoining the connecting embankment.

15 Claims, 8 Drawing Sheets

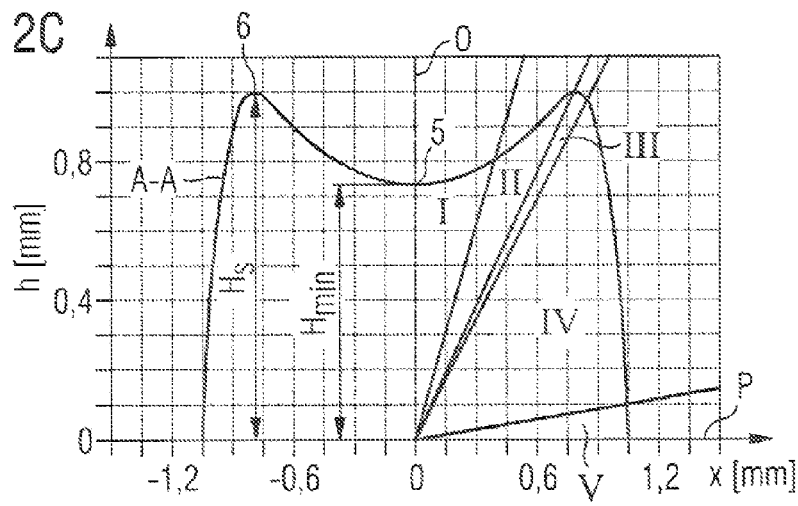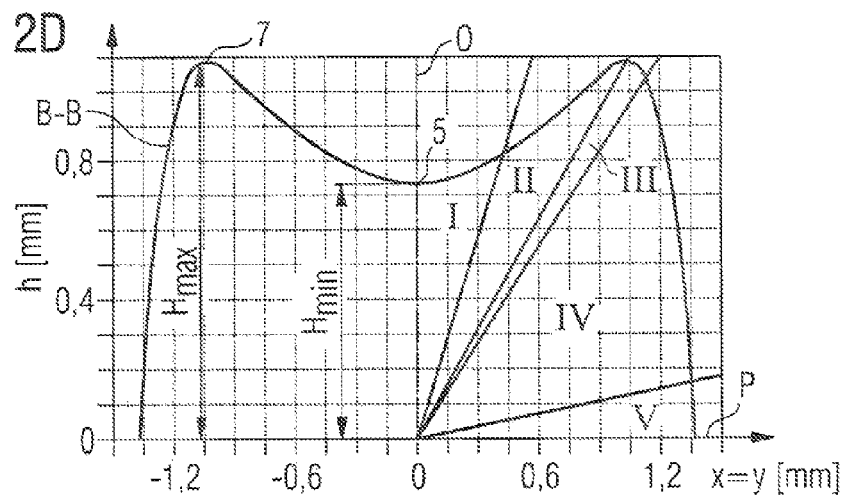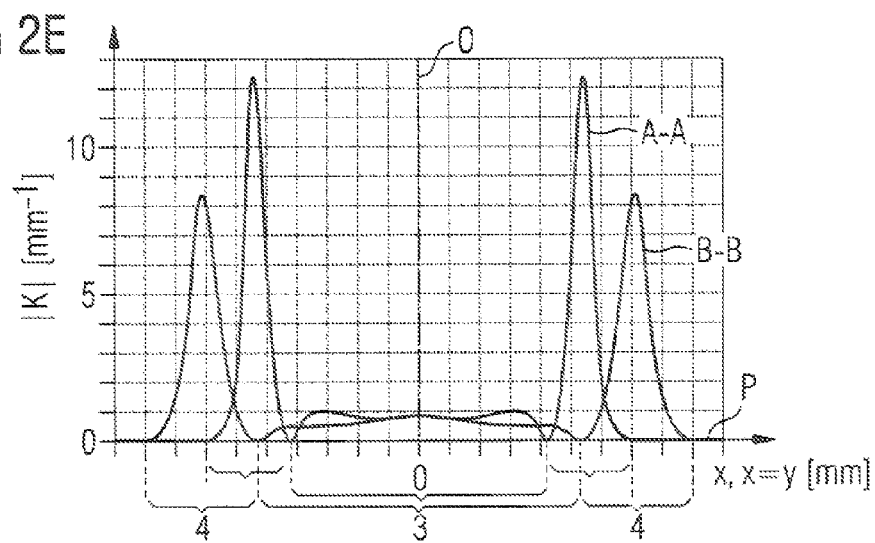

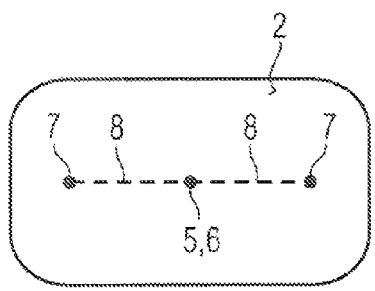
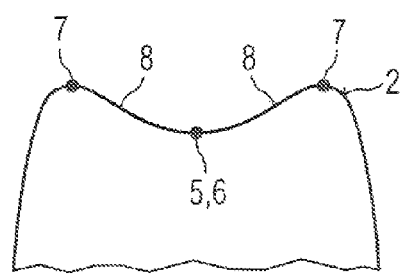
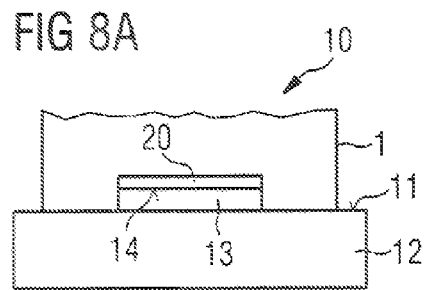
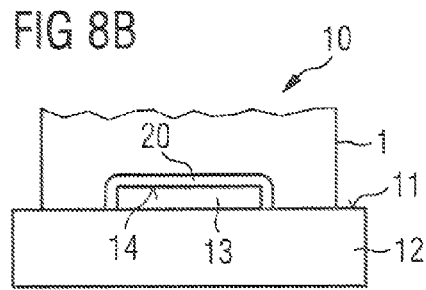
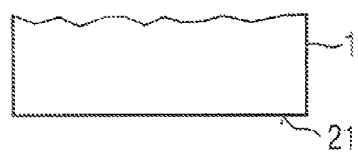
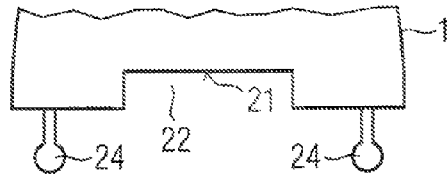
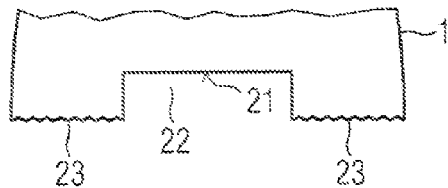

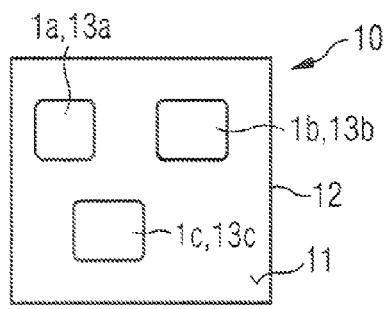
FIG 12A
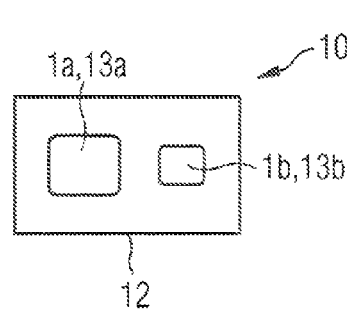
FIG 12B
FIG 13A
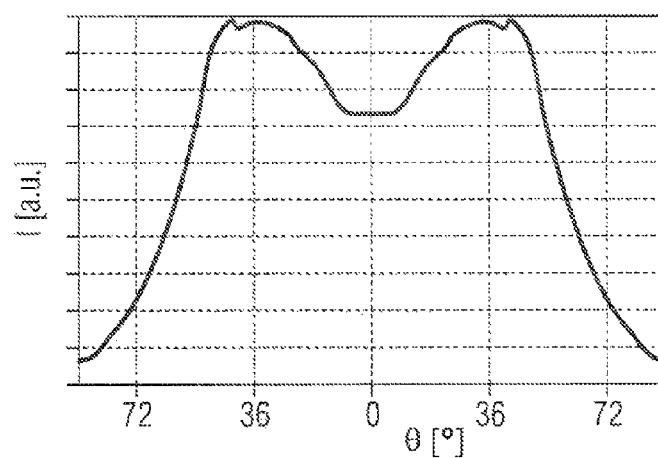
FIG 13B
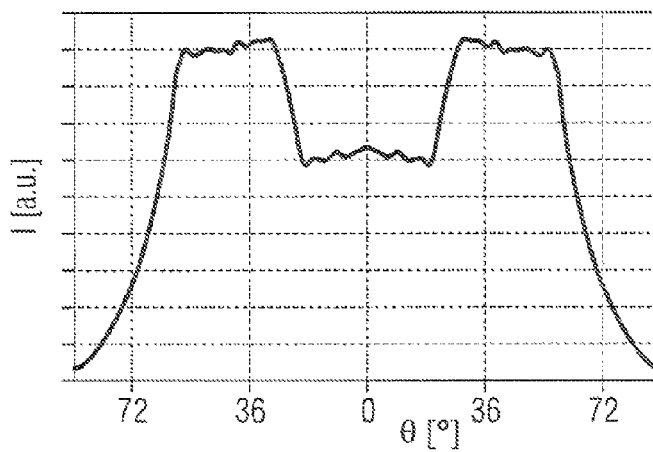

OPTOELECTRONIC SEMICONDUCTOR COMPONENT, LIGHTING DEVICE AND LENS

RELATED APPLICATIONS

This is a §371 of International Application No. PCT/EP2010/070820, with an international filing date of Dec. 28, 2010 (WO 2011/098191 A1, published Aug. 18, 2011), which is based on German Patent Application No. 10 2010 007 751.8 filed Feb. 12, 2010, the subject matter of which is incorporated herein by reference.

TECHNICAL FIELD

This disclosure relates to a lens. It further relates to an optoelectronic semiconductor component with such a lens and to a lighting device with such optoelectronic semiconductor components.

BACKGROUND

DE 10 2006 050 880 A1 discloses an optoelectronic component and a lighting device. It could nonetheless be helpful to provide a lens which uniformly illuminates a surface remote therefrom. It could further be helpful to provide a semiconductor component with such a lens and a lighting device with such semiconductor components.

SUMMARY

I provide an optoelectronic semiconductor component for a lighting device including a carrier, at least one optoelectronic semiconductor chip mounted on the carrier and which comprises a radiation passage face remote from the carrier, by which a plane is defined, and a lens, including 1) a radiation exit face, which, relative to a height above the plane, exhibits a minimum, in particular in a central region and at least two local maxima, and 2) at least two connecting embankments which each extend from one of the maxima to another of the maxima, and each connecting embankment comprises a saddle point higher than the minimum and lower than the maxima adjoining the connecting embankment.

I also provide a lighting device including a connection board and a plurality of optoelectronic semiconductor components wherein at least some of the semiconductor components are arranged at grid points of a regular grid on the connection board.

I further provide a lens for an optoelectronic semiconductor component for a lighting device with a radiation exit face and with an optical axis, wherein the radiation exit face exhibits a minimum pierced by the optical axis and lies in a central region, exhibits at least two local maxima, and includes at least two connecting embankments which each extend from one of the maxima to another of the maxima and which, together with the maxima, completely surround the minimum laterally, and each connecting embankment comprises a saddle point higher than the minimum and lower than the maxima adjoining the connecting embankment.

BRIEF DESCRIPTION OF THE DRAWINGS

FIGS. 1 to 3, 8 and 12 show schematic diagrams of examples of optoelectronic semiconductor components described herein.

FIGS. 4 to 6 and 9 show schematic representations of examples of lenses described herein.

FIG. 7 is a schematic representation of a modified lens,

FIG. 13 is a schematic representation of an emission characteristic of a semiconductor component described herein in an optical far field.

DETAILED DESCRIPTION

Figure 1A:
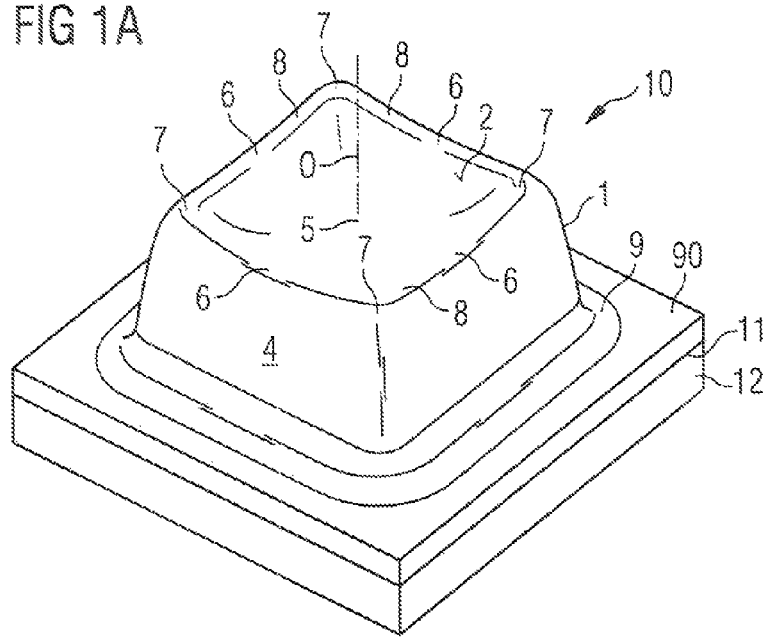

The optoelectronic component may comprise a carrier with a carrier top. The carrier may comprise or preferably consists of a ceramic, a glass, a metal core printed circuit board or a printed circuit board. The carrier may comprise means for electrical contacting, for example, vias and electrically conductive coatings in sub-regions on the carrier top and/or a carrier bottom opposite the carrier top.

The semiconductor component may comprise at least one optoelectronic semiconductor chip mounted on the carrier top. The semiconductor chip is preferably a light-emitting diode. The semiconductor chip is based in particular on at least one inorganic semiconductor material. The semiconductor chip optionally comprises a conversion element, the conversion element designed to convert electromagnetic radiation generated in an active semiconductor layer of the semiconductor chip at least in part into radiation of another wavelength.

The semiconductor chip may comprise a radiation passage face remote in particular from the carrier top. The radiation passage face is a major side of the semiconductor chip and in particular oriented parallel to the carrier top. The radiation passage face additionally defines a plane. In particular, the radiation passage face is part of the plane, main directions of extension of the radiation passage face lying in the plane. For example, the plane is oriented perpendicularly to a direction of growth of a semiconductor layer sequence of the semiconductor chip, the plane intersecting the radiation passage face as far as possible such that the plane is an equalization plane of the radiation passage face, which arises for instance as a result of averaging over, for example, roughening patterns.

The semiconductor component may comprise at least one lens. The lens comprises a radiation exit face, which is a boundary face of the lens remote from the carrier. The radiation exit face is preferably a contiguous, smooth face, via which all or the majority of the radiation generated by the semiconductor chip leaves the semiconductor component. The lens preferably comprises exactly one radiation exit face. "Smooth" may mean that the radiation exit face is free of corners and edges and/or is differentiable. The lens is transmissive, preferably transparent for at least part of the radiation generated in the semiconductor chip. A height may be indicated for each point of the radiation exit face. The height is a distance from the corresponding point of the radiation exit face to the plane defined by the radiation passage face of the semiconductor chip, measured in a direction perpendicular to the plane.

The lens may comprise a minimum. The minimum is located in particular in a central region of the lens. The central region is preferably of concave curvature and surrounded by a peripheral region which is preferably of convex curvature. "Minimum" means that the height of the radiation exit face is at its smallest, relative to the plane, at least in the local surroundings of the minimum.

The lens may comprise an optical axis. For example, the optical axis is oriented perpendicularly to the plane, which is defined by the radiation passage side of the semiconductor chip, and constitutes an axis of symmetry or a straight line arranged in at least one plane of symmetry of the lens. The optical axis preferably passes through the radiation exit face of the lens in the central region, in particular in the minimum.

The lens may comprise at least two local maxima, which are preferably located in the convexly curved peripheral region. In other words, the maxima then exhibit a greater distance from the optical axis than the minimum. A maximum is a region of the radiation exit face which has a greater height, relative to the plane defined by the radiation passage side, compared to the area surrounding the radiation exit face. The maxima, when viewed in plan view, are preferably each located in corner regions of the lens.

The lens may comprise at least one, particularly preferably at least two connecting embankments. The connecting embankments are raised, ridge-like lens structures, which extend from one of the maxima to another of the maxima of the radiation exit face. Relative to the plane defined by the radiation passage face, a crest line of the connecting embankments lies higher than the minimum of the radiation exit face and lower than the maxima adjoining the connecting embankment. In the region of the crest line or of a highest point of the connecting embankments, the latter are in particular parabolic in shape, when viewed in cross-section. It is possible for the minimum to be completely boxed in or framed by the connecting embankments and/or the maxima. It is additionally possible for the crest line to be a straight line, in particular when viewed in plan view.

Each connecting embankment may comprise a saddle point. The saddle point is higher than the minimum and lower than the maxima adjoining the connecting embankment. The saddle point may be the lowest point of the crest line of the connecting embankment and at the same time the highest point of the radiation exit face in a radial direction away from the optical axis.

The radiation exit face of the lens may be described and/or approximated by a two-dimensional, differentiable function. Two-dimensional means in particular that the function depends on two variables by which, for example, the radiation passage side of the semiconductor chip or a plane parallel to the radiation passage side may be generated, and that the function supplies a function value for a coordinate in a direction perpendicular to the radiation passage side or to this plane. This means in particular that an average profile of the radiation exit face of the lens may be represented by this function. For example, the function corresponds to the shape of a mold with which the lens is produced. In other words, the differentiable function may be a desired shape of the radiation exit face. Relatively small deviations from this desired shape may occur, for instance as a result of manufacturing or due to irregularities in the lens material.

If the radiation exit face may be represented by such a differentiable function, the terms minimum, maximum and saddle point relative to this function, which represents the radiation exit face, preferably have a meaning in their mathematical sense. In particular, in the minimum and the maxima the first derivative of the function is then equal to zero and a change of sign of the second derivative occurs at the minimum and at the maxima.

The optoelectronic semiconductor component may be provided for a lighting device and comprise a carrier and at least one optoelectronic semiconductor chip. The semiconductor chip is mounted on the carrier and comprises a radiation passage side remote from the carrier by which a plane is defined. In addition, the semiconductor component includes a lens with a radiation exit face. In each case relative to a height above the plane, the lens comprises a minimum, in particular in a central region of the radiation exit face, together with at least two local maxima and at least two connecting embankments. The connecting embankments each extend from one of the maxima to another of the maxima and each comprise a saddle point which is higher than the minimum and lower than the maxima adjoining the connecting embankment. The lens is preferably molded to the semiconductor chip and the carrier, for example, by injection molding or transfer molding.

In other words, the semiconductor component preferably contains a lens in which a periphery surrounding a central region does not exhibit a constant height. In this way, a greater proportion of radiation is emitted in a lateral direction away from the optical axis, the lateral direction defined by the optical axis and by one of the maxima, than in the case of a lens which has a periphery of constant height. If the semiconductor components are, for example, arranged in a square grid on a connection plate of a lighting device such that in a diagonal direction the distance between adjacent semiconductor components is increased, more radiation may be emitted in the diagonal direction by such a lens and in this way more uniform illumination of a face to be illuminated may be achieved.

A lateral dimension of the lens, measured in the plane defined by the radiation passage face, may amount to at most ten times the lateral extent of the semiconductor chip in the same direction. In particular, the lateral dimension of the lens amounts to at most five times or at most three times the lateral extent of the semiconductor chip. In other words, the lateral dimension of the lens is comparable to the lateral extent of the semiconductor chip. The lens is thus comparatively small.

The lateral dimension of the lens, measured in the plane, may be at least 1.5 times or at least twice as great as the lateral extent of the semiconductor chip, measured in the same direction. The lateral dimension of the lens is preferably between 2.5 times and 15 times inclusive the lateral extent of the semiconductor chip.

The distance between two adjacent maxima may be 0.4 times to 0.9 times the maximum lateral dimension of the lens. The dimension of the lens should here be determined in the plane which is defined by the radiation passage face, and in the same direction as the distance between the two maxima. In other words, the distance between the two maxima is determined in plan view of the semiconductor component, as is the lateral dimension of the lens. The distance between the maxima is 0.5 times to 0.85 times the lateral dimension of the lens.

The height $H_S$ of the saddle point may be at least 1.05 times, preferably at least 1.2 times the height $H_{min}$ of the minimum. Alternatively or in addition, the height $H_S$ of the saddle point may be at most 2.0 times or at most 1.5 times the height $H_{min}$ of the minimum.

The height $H_{max}$ of the maxima, relative to the plane, may be in each case at least 1.05 times or at least 1.25 times the height $H_{min}$ of the minimum. Alternatively or in addition, the height $H_{max}$ of the maxima may be in each case at most 2.25 times or at most 1.75 times the height $H_{min}$ of the minimum.

The height $H_{min}$ of the minimum may be, relative to the plane, at most 4.0 times or at most 1.0 times an edge length of the semiconductor chip. Alternatively or in addition, the height $H_{min}$ of the minimum may be at least 0.6 times or at least 0.8 times the edge length of the semiconductor chip. If the semiconductor chip is square in shape, the edge length is a side length or an average side length of the semiconductor chip, when viewed in plan view.

The magnitude of an average curvature of the radiation exit face of the lens in the central region may be less than the magnitude of the curvature in the maxima and in the saddle points. In other words, the radiation exit face is more strongly curved in the region of the maxima and the saddle points, as compared with the central region.

The magnitude of the curvature of the radiation exit face may exhibit a maximum value at a point of the radiation exit face of the lens which is further from the optical axis than the saddle point or the maximum. In this respect, the lens should be viewed in cross-section, the cross-section extending parallel to and through the optical axis and through the corresponding saddle point or the corresponding maximum. In other words, maximum curvature is then not present in the maximum or in the saddle point, but rather at a point of the radiation exit face which is further from the optical axis. Preferably, the magnitude of curvature in the lateral direction is maximal in a region located outside a region of the radiation exit face surrounded by the maxima and the crest lines of the connecting embankments.

An angle θ2 between the optical axis and the saddle points, relative to a piercing point of the optical axis through the radiation passage face of the semiconductor chip, may be 30° to 50°, in particular 35° to 45°. Alternatively or in addition, an angle θ1 between the optical axis and the maxima, relative to the piercing point, is 35° to 60°, in particular 40° to 55°. It is preferably additionally the case that the angle θ2 is in each case smaller than the angle θ1.

Furthermore, a lighting device and a lens are provided. The lighting device preferably includes a plurality of optoelectronic semiconductor components, as indicated in relation to one or more of the previous examples. The lens is used, for example, in an example of the semiconductor components, as indicated above. Features of the optoelectronic semiconductor component are therefore also disclosed for the lighting device and for the lens and vice versa.

The lighting device may comprise a plurality of optoelectronic semiconductor components and a connection board. The connection board may be a backplane and/or a printed circuit board. At least some of the semiconductor components are arranged at grid points of a regular grid on the connection board.

The lens may be provided, for an optoelectronic semiconductor component for a lighting device and may comprise a radiation exit face and an optical axis. The radiation exit face has a minimum which is in particular pierced by the optical axis and located in particular in a central region of the radiation exit face. The radiation exit face further comprises at least two maxima and at least one, particularly preferably at least two, connecting embankments. By way of the connecting embankments, in each case one of the maxima connects to another of the maxima in the manner of an embankment. The connecting embankments, together with the maxima, completely surround the minimum in a lateral direction. Each connecting embankment comprises a saddle point which is higher than the minimum and lower than the maxima adjoining the connecting embankment.

A lens described herein, an optoelectronic semiconductor component described herein and a lighting device described herein will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

Figure 1B:
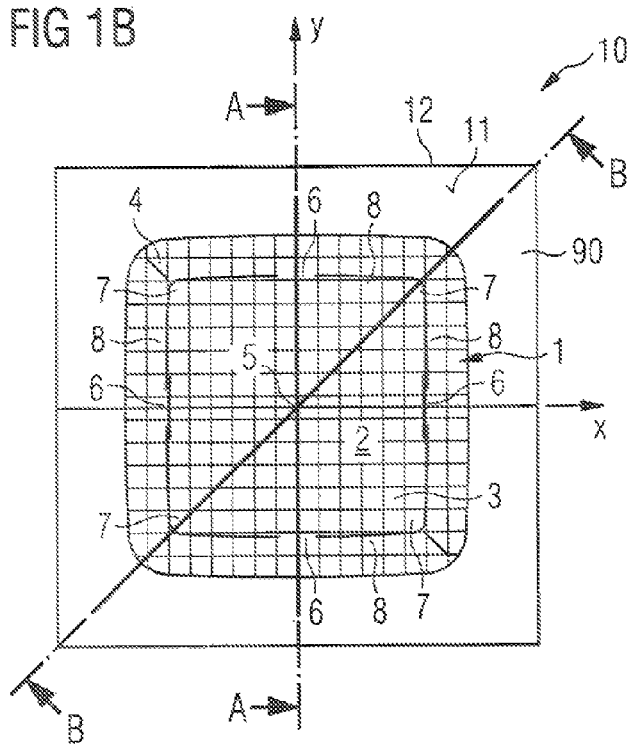
Figure 2A:
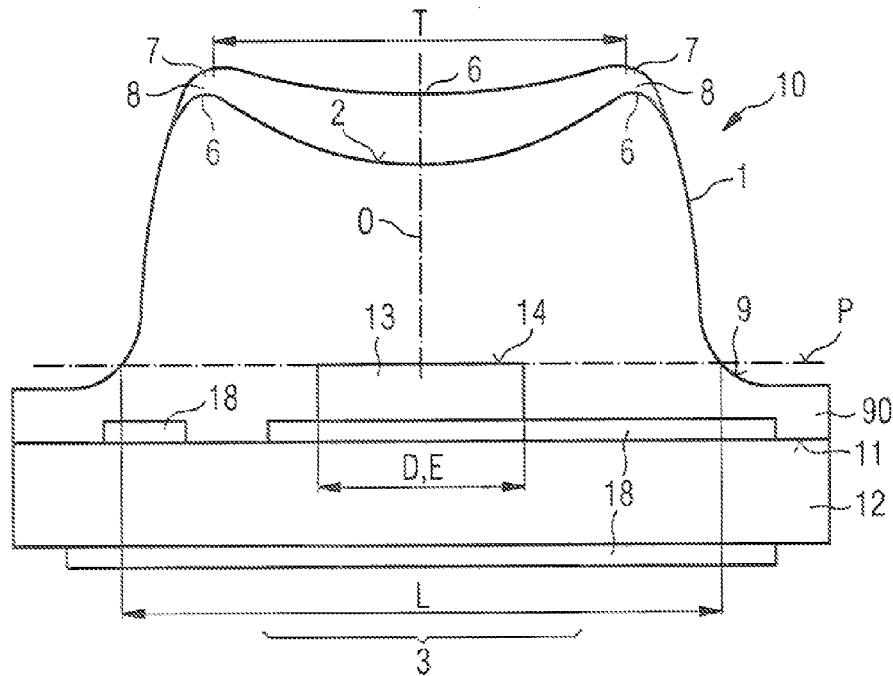
Figure 2B:
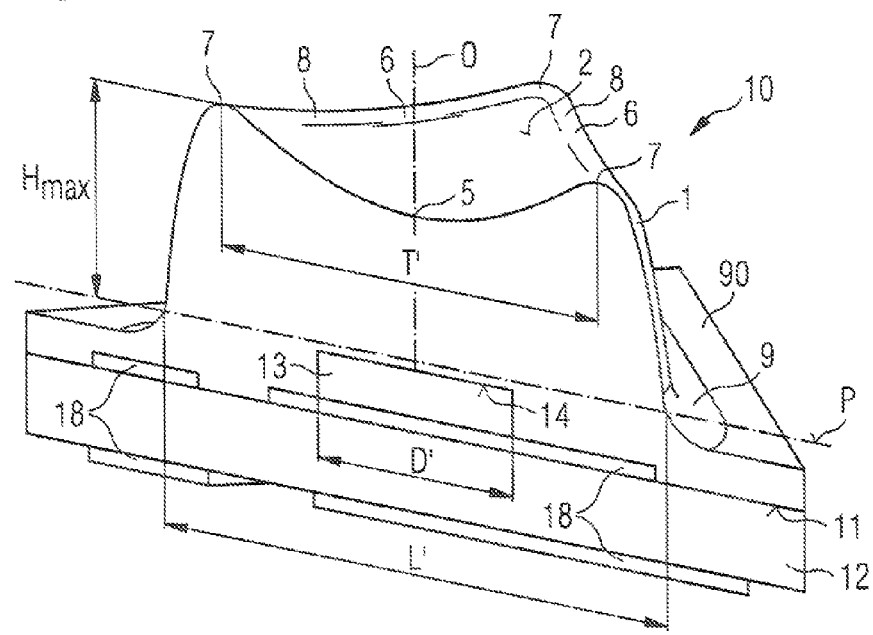

FIG. 1A shows a schematic, perspective representation and FIG. 1B shows a plan view of a semiconductor component 10. Furthermore, FIG. 2A shows a sectional representation along line AA in FIG. 1B and FIG. 2B shows a sectional representation along line BB in FIG. 1B. FIGS. 2C, 2D and 2E show heights h and the magnitude of a radius of curvature |K| for a lens 1 of the semiconductor component 10 according to FIG. 1.

The semiconductor component 10 comprises a carrier 12, for example, of ceramic with a carrier top 11. An optoelectronic semiconductor chip 13 with a radiation passage face 14 is mounted on the carrier top 11. The semiconductor chip 13 preferably comprises a light-emitting diode which emits ultraviolet and/or visible radiation when in operation. The substrate 12 additionally comprises electrical terminals 18, mounted on the carrier top 11 and on a carrier bottom opposite the carrier top 11 and are intended for electrical contacting of the semiconductor chip 13. The radiation passage face 14 of the semiconductor chip 13 remote from the carrier 12 defines a plane P oriented parallel to the carrier top 11 and wherein the radiation passage face 14 is part of the plane P.

The lens 1 is produced on the carrier 12, for example, by injection molding or transfer molding, being molded form-fittingly to the carrier 12 and to the semiconductor chip 13. In other words, there is no air gap between the semiconductor chip 13 and the lens 1. Since the lens 1 is molded onto the carrier 12, no retaining devices are provided on the lens 1. Mechanical fixing of the lens to the carrier 12 thus proceeds by way of adhesion forces adhering the material of the lens 1 to in particular the carrier top 11 and the electrical terminals 18.

To improve adhesion of the lens 1 to the carrier top 11, a base 90 is optionally incorporated into the lens 1, which base extends over the entire carrier top 11. The top of the base 90 remote from the carrier 12 preferably extends parallel to the carrier top 11. In a transitional region between the lens 1 and the base 90 peripheral rounding 9 is provided, which ensures a gentle transition between the lens 1 and the base 90. The peripheral rounding 9 may in particular reduce material stresses and the risk of cracking in or on the lens 1. The height of the peripheral rounding 9 amounts, for example, to at most 25% or at most 15% of the height of the maxima 7, relative to the top of the base 90 or relative to the plane P.

The lens 1 comprises a radiation exit face 2 through which the radiation generated in the semiconductor chip 13 when in operation leaves the semiconductor component 10. An optical axis O of the lens I extends perpendicularly to the plane P, preferably also centrally through the semiconductor chip 13. In a central region 3 of the lens 1 there is located a minimum 5. In the region of the minimum 5 the radiation exit face 2 is pierced by the optical axis O. Furthermore, the lens 1 comprises four maxima 7 and four connecting embankments 8 which completely surround the minimum 5 in the central region 3, cf. in particular FIG. 1B. The maxima 7 are in each case located at an identical height $H_{max}$, relative to the plane P. The connecting embankments 8 which in each case extend between two of the maxima 7, each comprise a saddle point 6 higher than the minimum 5 and lower than the maxima 7.

When viewed in plan view, the lens 1 is subdivided into four quadrants by an x axis and a y axis, cf. FIG. 1B. The four quadrants of the lens 1 are identical in shape. When viewed in plan view the lens 1 comprises a square basic shape with rounded corners.

The semiconductor chip 1 has an edge length E, for example, of around 750 µm, cf. FIG. 2A. The lateral dimension L of the lens, measured in the plane P, is around 2100 µm according to FIG. 2A. The distance T between the maxima 7 is around 1500 µm, and the distance between mutually facing saddle points 6 is around 1600 µm. Since the lens 1 has a square outline, the distance T', the lateral dimension L' and the lateral extent D' of the semiconductor chip 13 according to the sectional representation in FIG. 2B, are in each case greater by a factor √2 than in FIG. 2A. The height $H_{min}$ of the minimum 5 is around 730 μM, the height $H_S$ of the saddle points 6 is 990 μm and the height $H_{max}$ of the maxima 7 is roughly 1080 μm. The total lateral extent of the carrier 12 is roughly 3.0 mm, cf. FIG. 2A.

FIG. 2C shows the profile of the radiation exit face 2 of the lens 1 along the x axis, plotted in mm relative to the height h above the plane P. FIG. 2D is a corresponding representation along the line BB in FIG. 1B. Finally, FIG. 2E shows the magnitude of the curvature |K| of the radiation exit face 2 along lines AA and BB in FIG. 1B.

The height h of the radiation exit face 2 of the lens I may be indicated, relative to the plane P, by an eighth-degree polynomial. In particular the polynomial is a two-dimensional function and has the form $$h(x,y)=a_0+a_1x+a_2y+a_3(x^2+y^2)+a_4(x^4+y^4)+a_5(x^2y^2)+a_6(x^6+y^6)+a_7(x^4y^2x^2y^4)+a_8(x^8+y^8)$$

A respective actual value of the heights h(x,y) lies at the value resulting from the above-stated formulae, in particular with a tolerance of at most 0.1 times, preferably at most 0.05 times or at most 0.02 times. Alternatively or in addition, for the height h(x,y) the tolerance amounts to at most 0.3 mm or at most 0.1 mm.

At least the coefficients $a_0$, $a_3$, $a_5$ and $a_7$ are ≠0. In the example according to FIG. 1 all the coefficients, apart from coefficients $a_1$ and $a_2$, are ≠0. Coefficients $a_0$, $a_3$, $a_6$ are preferably >0 and/or coefficients $a_1$, $a_5$, $a_7$ and $a_8$ are preferably <0. Preferably, the value of coefficient $a_5$ is additionally greater than the value of coefficient $a_4$ which is in turn preferably lower than the value of coefficient $a_7$. In addition, with regard to value, coefficients $a_6$ and $a_8$ may be greater than the other coefficients, wherein in particular the value of coefficient $a_8$ is maximal. Especially with the stated tolerance for the height h(x,y), the following relationship applies for the lens according to FIG. 1:

$$h(x,y)=0.73+0.44(x^2y^2)-0.22(x^4+y^4)-0.31(x^2y^2)+1.64(x^6+y^6)-0.18(x^4y^2x^2y^4)-2.12(x^8+y^8)$$

In the central region 3 the radiation exit face 2 of the lens 1 is concavely curved and in the peripheral area 4 it is convexly curved. The boundary between the central region 3 and the peripheral region 4 thus extends in particular along a line along which the sign of the curvature of the radiation exit face 2 changes. The saddle points 6 and the maxima 7 are each located in the peripheral region 4. A point where the radiation exit face 2 exhibits maximum curvature is further from the optical axis O than the maxima 7 and the saddle points 6, cf. FIG. 2E. The optionally present peripheral rounding 9 and the base 90 are in each case not taken into account in FIGS. 2C, 2D and 2E and in the stated formulae.

Figure 3A:
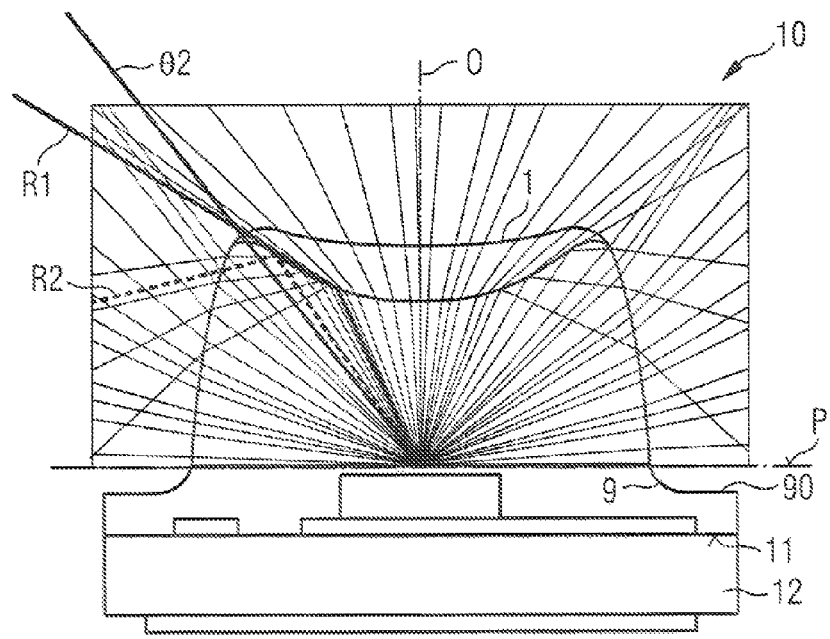
Figure 3B:
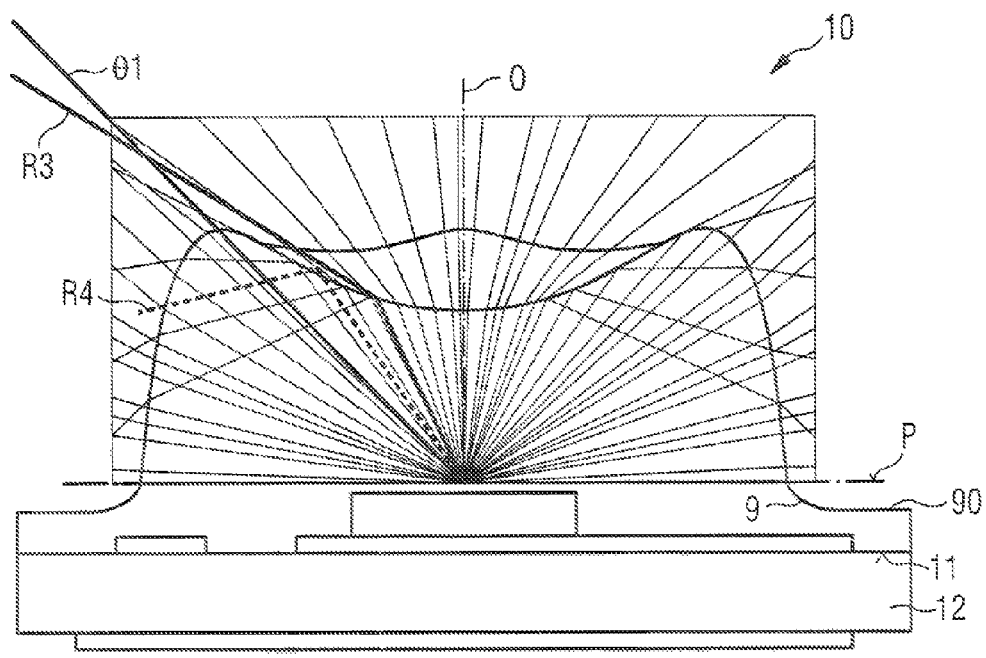

An emission characteristic of the lens 1 along the line AA of FIG. 1B is shown in FIG. 3A and along the line BB according to FIG. 1B in FIG. 3B. The angles and angular ranges stated below relate to the optical axis O and to a piercing point of the optical axis O through the radiation passage face 14 of the semiconductor chip 13, see also FIGS. 2C and 2D.

In a first angular range I of from around 0° to around 25° radiation emitted at the piercing point of the radiation passage face 14 is in each case refracted away from the optical axis O on passage through radiation exit face 2 of the lens 1, see rays R1 and R3 in FIG. 3. In an optionally indicated angular range II of from around 26° to around 40°, internal total reflection occurs at the radiation exit face 2, such that radiation is deflected away from the optical axis O, cf. the rays R2 and R4. In a third range III, which is comparatively small, radiation is refracted away from the optical axis O. In a fourth range IV refraction occurs in turn towards the optical axis O, in an angular range of from around 45° to around 84°. In a fifth range V between roughly 84° and 90° refraction towards the optical axis O again takes place.

A critical angle θ2, up to which refraction away from the optical axis O takes place at the radiation exit face 2, is around 41.2° according to FIG. 3A, and around 47.5° according to FIG. 3B. An angular position of the saddle points 6 is additionally roughly around 38.5°, see FIG. 3A, and an angular position of the maxima 7 is around 43.6°, see FIG. 3B.

A ray profile relates in FIGS. 2 and 3 in each case to a refractive index of a material of the lens 1 of around 1.4. In the case of materials with a refractive index differing therefrom, the shape of the radiation exit face 2 must be adapted to achieve a corresponding ray profile.

Figure 4A:
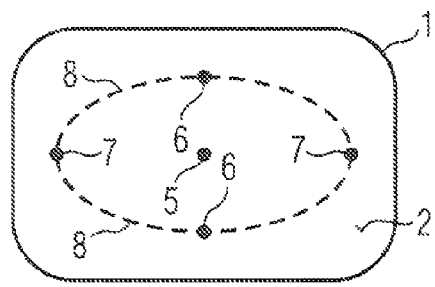
Figure 4B:
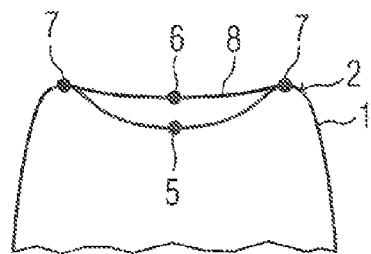
Figure 5A:
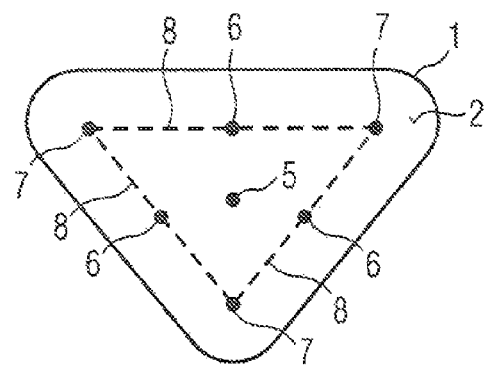
Figure 5B:
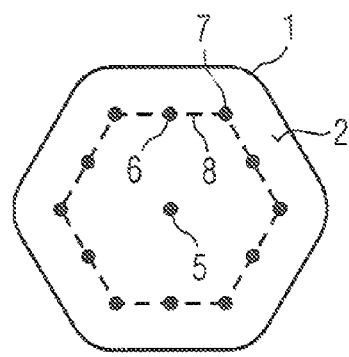
Figure 6A:
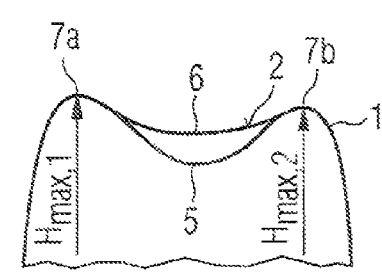
Figure 6B:
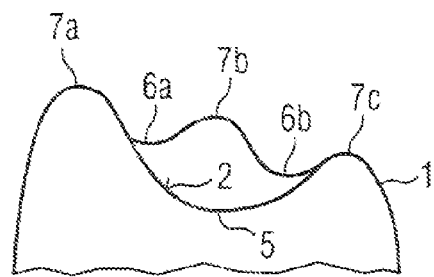

FIGS. 4 to 6 show further examples of the lens 1, see the plan views in FIGS. 4A, 5A, 5B and the sectional representations in FIGS. 4B, 6A, 6B. According to FIG. 4 the lens 1 comprises two maxima 7 and two connecting embankments 8 and two saddle points 6. The connecting embankments 8 are curved, see FIG. 4A, and completely enclose the minimum 5, together with the maxima 7. Crest lines of the connecting embankments 8 are shown in the figures as broken lines. In plan view, the basic shape of the lens 1 is rectangular, with rounded corners, the maxima 7 being located at the corners.

In plan view, the lens 1 according to FIG. 5A exhibits a triangular basic shape and has three maxima 7 and three saddle points 6. The lens 1 according to FIG. 5B is hexagonal in plan view and, like the lens according to FIG. 5A too, has rounded corners. The connecting embankments 8 connect the associated maxima, when viewed in plan view, in a straight line. The lens 1 may thus exhibit the same number of maxima, saddle points and connecting embankments.

Due to the non-four-fold geometry, the examples of the lens I according to FIGS. 4 and 5 do not comply with the formula stated in relation to the example according to. FIGS. 1 and 2. The features explained in detail in relation to the example according to FIG. 1 may, however, also be applied analogously to the other examples of the lens 1.

In FIG. 6, the lens according to FIG. 1 is modified. According to FIG. 6A, the coefficients $a_1$ ≠0 and $a_2$=0. In this way the maxima 7a, 7b have different heights $H_{max,1}$ and $H_{max,2}$. According to FIG. 6B, the two coefficients $a_1$ and $a_2$ are of equal value and different from 0. The maxima 7a, 7b, 7c are in this way at different heights. It is likewise possible for the saddle point 6a then to be higher than the maximum 7c. With such a configuration of the lens 1, as shown in FIGS. 6A, 6B, an asymmetric emission characteristic may be achieved. Such lenses 1 may, for example, be used in corner regions of a lighting device connection board.

FIG. 7 shows a modified lens. When viewed in plan view, the lens has a rectangular basic shape, see FIG. 7A. The two maxima 7 are connected via just one connecting embankment 8, whereby the minimum 5 coincides with the saddle point 6, see also the sectional representation in FIG. 7B.

In the example of the semiconductor component 10 according to FIG. 8A, shown in. sectional representation, the semiconductor chip 13 comprises a conversion element 20 on the radiation passage side 14, for example, in the form of an adhesively-bonded or printed-on lamina. At least part of the radiation generated in an active semiconductor layer of the semiconductor chip 13 is converted by way of the conversion element 20 into radiation of another wavelength. The lens 1 is molded form-fittingly onto the semiconductor chip 13 with the conversion element 20.

According to FIG. 8B, the conversion element 20 surrounds a semiconductor body of the semiconductor chip 13 on all sides, with the exception of a side facing the carrier 12. In this case too, the lens 1 is formed form-fittingly with the semiconductor chip 13 and the carrier 12.

In this configuration of the lens 1 according to FIG. 8, the lens 1 thus does not comprise a radiation entrance face, i.e. there is no interlayer present between the material of the lens 1 and the semiconductor chip 13. Design options for the lens 1 which differ from this are shown in sectional representation according to FIG. 9.

According to FIG. 9A, a radiation entrance face 21 of the lens 1 is planar in shape. In FIG. 9B the lens 1 is provided with a recess 22 which is cuboid and located in the radiation entrance face 21. The lens I may optionally comprise anchoring elements 24, by means of which the lens 1 may be locked to a carrier, not shown in FIG. 9B, for example, by a plug-in action. A space between the radiation entrance face 21 and a semiconductor chip 13 mounted in the recess 22, not shown in FIG. 9, may be filled with a bonding agent or with a material for refractive index adaptation. According to FIG. 9C, lateral regions of the lens 1 are provided with roughening 23. According to FIG. 9D, the lens 1 comprises a recess 22 and the light inlet face 21 is dome-shaped.

Figure 10:
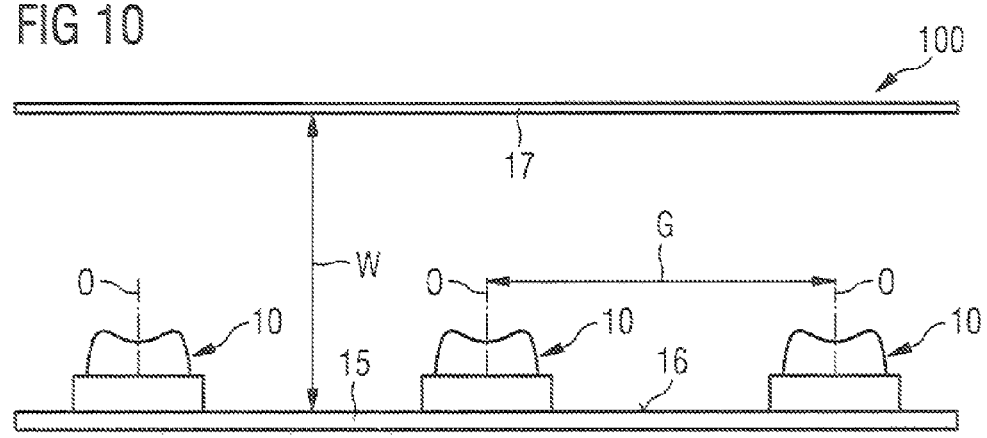
FIGS. 10 to 11 are schematic representations of examples of lighting devices described herein.

FIG. 10 shows an example of a lighting device 100. On the top 16 of a connection board 15, a number of the semiconductor components 10 are mounted at spacings G at grid points of a regular grid. The spacing G, calculated between the optical axes 0 of adjacent semiconductor components 10, is preferably between 20 mm and 200 mm inclusive and also corresponds to a grid constant G of the grid. The top 16 may be constructed to reflect diffusely or in specular manner. A reflection coefficient of the top 16 preferably amounts to at least 90% or at least 92.5%. Reflective in specular manner here means that the top 16 behaves like a smooth mirror surface. Furthermore, the lighting device 100 comprises a diffuser plate 17. The diffuser plate 17 is mounted, for example, at a distance W of 10 mm to 100 mm from the top 16 of the connection board 15.

The diffuser plate 17 may be a plate exhibiting a reflectivity and a transmissivity of in each case around 50%. It may also be a plate which exhibits a reflectivity of around 75% and transmission of around 18%. With a distance W of 37 mm and with lenses 1 according to FIG. 1, the quotient of a local, minimum energy density and a local, maximum energy density on the side of the diffuser plate 17 remote from the connection board 15 is greater than around 94%, whereas without the diffuser plate 17 this quotient, in the same plane, is greater than around 89%. The color non-uniformity amounts, relative to a $c_x$ coordinate in the CIE standard chromaticity diagram, with a $c_x$ value of around 0.27, in each case to at most 0.01. With a distance W of only 30 mm and with lenses, not shown here, modified to this smaller distance W relative to the lenses 1 of FIG. 1, this quotient without the diffuser plate 17 is more than around 70% and with the diffuser plate 17 is more than around 84%. The color non-uniformity, relative to the $c_x$ coordinate in the CIE standard chromaticity diagram, amounts without the diffuser plate 17 to at most 0.02 and with the diffuser plate 17 to at most 0.01.

In other words, the lighting device 10 illustrated allows the achievement of highly uniform lighting of a surface for example close to the diffuser plate 17, with a lighting device 100 of only small thickness. This is made possible in particular by the lenses 1.

Figure 11A:
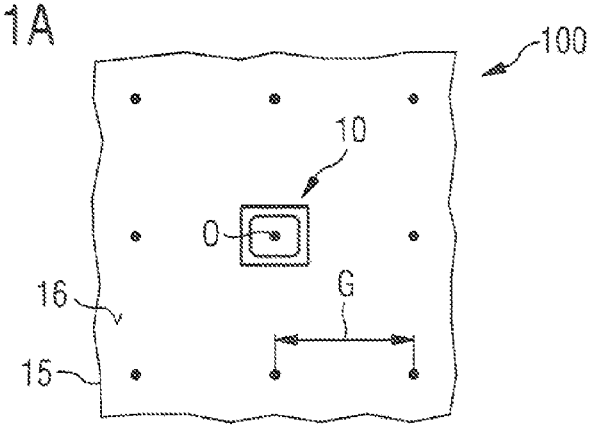
Figure 11B:
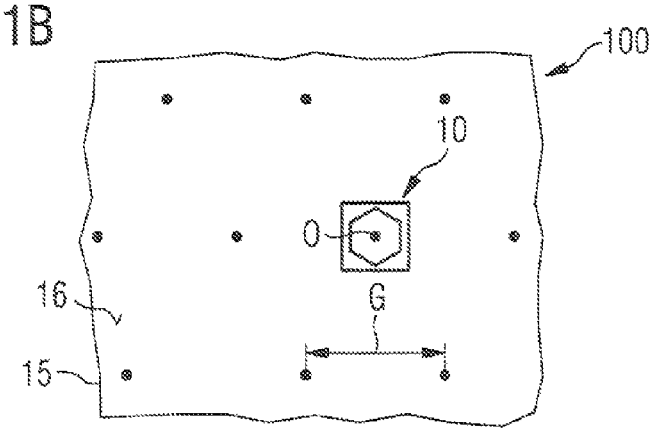

FIG. 11 shows plan views of the connection board 15 of further examples of the lighting device 100. According to FIG. 11A, the grid in which the semiconductor components 10 are arranged is square, whereas in FIG. 11B it is hexagonal. Corner regions of the lenses 1 of the semiconductor components 10 in each case point in directions which correspond to bisectors between immediately neighbouring grid points. In this way, a comparatively high light intensity may be achieved in these directions, according to FIG. 11A therefore for instance along diagonals. At corners and/or edges of the connection board 15, the semiconductor components 10 may be arranged rotated or, for example, shaped according to FIG. 6.

The semiconductor components 10 according to FIG. 11 comprise in particular semiconductor components which emit white light, i.e., for example, semiconductor components 10 according to FIG. 8. It is likewise possible for a semiconductor component 10 to comprise red-, green- and blue-emitting semiconductor chips 13a, 13b, 13c. The semiconductor chips 13a, 13b, 13c are preferably each provided with their own lens 1a, 1b, 1c and arranged on the common carrier 12. The lenses 1a, 1b, 1c preferably additionally exhibit smaller dimensions than the example according to FIG. 1, see FIG. 12A.

According to FIG. 12B, a white-emitting semiconductor chip 13a is mounted on the common carrier 12 under the lens 1a. A semiconductor chip 13b with a comparatively small lens 1b is additionally mounted, which emits light in the red spectral range. Such semiconductor components 10 may, in particular when the lighting device 100 is used for the purpose of general lighting, ensure a high color rendering index of the emitted radiation. As an alternative to the example according to FIGS. 12A and 12B, it is also possible to mount in each case one lens and the associated semiconductor chip on their own separate carriers.

FIGS. 13A and 13B show an intensity I in an optical far field, plotted in arbitrary units, as a function of the emission angle θ in ° to the optical axis O. FIG. 13A shows a semiconductor component 10 according to FIGS. 1 and 2. FIG. 13B shows the intensity I in the optical far field for a further example of the semiconductor component.

The components, devices and lenses described herein are not restricted by the description given with reference to the examples. Rather, the components, devices and lenses encompass any novel feature and any combination of features, including in particular any combination of features in the appended claims, even if the feature or combination is not itself explicitly indicated in the claims or examples.

The invention claimed is:

1. An optoelectronic semiconductor component for a lighting device comprising:
   a carrier,
   at least one optoelectronic semiconductor chip mounted on the carrier and which comprises a radiation passage face remote from the cartier, by which a plane is defined, and
   a lens comprising:
   1) a radiation exit face, which, relative to a height above the plane, exhibits a minimum, in particular in a central region, and at least two Local maxima, and
   2) at least two connecting embankments which each extend from one of the maxima to another of the maxima, and each connecting embankment comprises a saddle point higher
   than the minimum and lower than the maxima adjoining the connecting embankment, wherein
   height h of the radiation exit face of the lens may be approximated, relative to the plane, by a polynomial of the form $$h(x,y) = a_0 + a_1 x + a_2 y + a_3(x^2+y^2) + a_4(x^4+y^4) + a_5 x^2 y^2 + a_6(x^6+y^6) + a_7(x^4 y^2 + x^2 y^4) + a_8(x^8+y^8)$$

with a tolerance of at most 0.05 times the respective local, actual height $h(x,y)$ of the radiation exit face, wherein at least a.sub.0, a.sub.3, a.sub.5 and a.sub.7 are other than zero.

2. The optoelectronic semiconductor component according to claim 1, wherein a lateral dimension of the lens in the plane is at most ten times a lateral extent of the semiconductor chip in the same direction, and the radiation exit face is a single, continuous, smooth surface.

3. The optoelectronic semiconductor component according to claim 1, wherein a distance between two of the maxima is 0.4 times to 0.9 times a lateral dimension of the lens in the plane in the same direction.

4. The optoelectronic semiconductor component according to claim 1, wherein, relative to the plane, height $H_S$ of the saddle points is 1.05 times to 2.0 times height $H_{min}$ of the minimum.

5. The optoelectronic semiconductor component according to claim 1, wherein, relative to the plane, height $H_{max}$ of the maxima is 1.05 times to 2.25 times height $H_{min}$, of the minimum.

6. The optoelectronic semiconductor component according to claim 1, wherein, relative to the plane, height $H_{min}$ of the minimum is 0.6 times to 4.0 times an edge length of the semiconductor chip.

7. The optoelectronic semiconductor component according to claim 1, wherein the lens is concavely curved in a central region and convexly curved in a peripheral area, at least on a side of the plane remote from the carrier and outside an optionally present peripheral rounding, and the saddle points and the maxima are each located in the peripheral region.

8. The optoelectronic semiconductor component according to claim 1, wherein a magnitude of an average curvature of a radiation exit face of the lens is less in a central region than in the maxima and than in the saddle points.

9. The optoelectronic semiconductor component according to claim 1, wherein an angle $\theta 2$ between the optical axis and the saddle points, relative to a piercing point of the optical axis through the radiation passage face of the semiconductor chip, is 30° to 50°, and an angle $\theta 1$ between the optical axis and the maxima is 35° to 60°, wherein $\theta 2 < \theta 1$.

10. The optoelectronic semiconductor component according to claim 1, wherein the lens is a potting body molded onto the carrier and onto the semiconductor chip.

11. The lighting device comprising a connection board and a plurality of optoelectronic semiconductor components according to claim 1, wherein at least some of the semiconductor components are arranged at grid points of a regular grid on the connection board.

12. The lighting device according to claim 11, further comprising a diffuser plate mounted at a distance of 10 mm to 100 mm from the connection board, wherein a top of the connection board facing the semiconductor components is reflective in a specular or diffuse manner, and a grid constant of the regular grid is 20 mm to 200 mm.

13. A lens for an optoelectrortic semiconductor component for a lighting device
with a radiation exit face and with an optical axis, wherein the radiation exit face:
exhibits a minimum pierced by the optical axis and lies in a central region,
exhibits at least two local maxima, and
comprises at least two connecting embankments which each extend from one of the maxima to another of the maxima and which, together with the maxima, completely surround the
minimum laterally, and
each connecting embankment comprises a saddle point higher than the minimum and lower than the maxima adjoining the connecting embankment, wherein height h of the radiation exit face of the lens may be approximated, relative to the plane, by a polynomial of the form $$h(x,y) = a_0 + a_1 x + a_2 y + a_3(x^2+y^2) + a_4(x^4+y^4) + a_5 x^2 y^2 + a_6(x^6+y^6) + a_7(x^4 y^2 + x^2 y^4) + a_8(x^8+y^8)$$

with a tolerance of at most at most 0.1 mm, wherein at least a.sub.0, a.sub.3, a.sub.5 and a.sub.7 are other than zero.

14. The lens according to claim 13, comprising at least three local maxima, wherein the number of maxima is equal to the number of saddle points and the number of connecting embankments.

15. The lens according to claim 13, wherein the radiation exit face of the lens is a two-dimensional, differentiable function, and minimum, maximum and saddle point have meanings in their mathematical sense so that in the minimum and the maxima, a first derivative of the function is equal to zero and a change of sign of a second derivative of the function occurs at the minimum and at the maxima.

* * * * *

UNITED STATES PATENT AND TRADEMARK OFFICE
CERTIFICATE OF CORRECTION

PATENT NO. : 8,674,391 B2  
APPLICATION NO. : 13/574811  
DATED : March 18, 2014  
INVENTOR(S) : Brick It is certified that error appears in the above-identified patent and that said Letters Patent is hereby corrected as shown below:

In the Claims:

In Column 10

At claim 1, line 56, please change "two Local maxima" to -- two local maxima --.

In Column 11

At claim 1, line 3, please change "at least a.sub.0, a.sub.3, a.sub.5 and a.sub.7are" to -- at least $a_0$, $a_3$, $a_5$ and $a_7$ are --.

In Column 12

At claim 13, line 33, please change "at least a.sub.0, a.sub.3, a.sub.5 and a.sub.7are" to -- at least $a_0$, $a_3$, $a_5$ and $a_7$ are --.

Signed and Sealed this  
Seventeenth Day of June, 2014

Michelle K. Lee  
*Deputy Director of the United States Patent and Trademark Office*